(12) United States Patent
Waterman

(10) Patent No.: US 11,495,701 B2
(45) Date of Patent: Nov. 8, 2022

(54) CONDUCTIVE INTERCONNECT FOR CONNECTING ADJACENT SOLAR CELLS IN A SOLAR CELL ASSEMBLY

(71) Applicant: The Boeing Company, Chicago, IL (US)

(72) Inventor: Dale H. Waterman, Chicago, IL (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/883,119

(22) Filed: May 26, 2020

(65) Prior Publication Data

US 2021/0376173 A1 Dec. 2, 2021

(51) Int. Cl.
*H01L 31/05* (2014.01)

(52) U.S. Cl.
CPC .......... *H01L 31/05* (2013.01); *H01L 31/0508* (2013.01)

(58) Field of Classification Search
CPC .. H01L 31/05; H01L 31/0508; H01L 31/0516
See application file for complete search history.

(56) References Cited

U.S. PATENT DOCUMENTS

| | | | |
|---|---|---|---|
| 3,459,597 A | 8/1969 | Baron | |
| 2007/0199592 A1* | 8/2007 | Agui | H01L 31/0508 136/256 |
| 2008/0000523 A1* | 1/2008 | Hilgarth | H01L 31/0443 136/255 |
| 2009/0038671 A1 | 2/2009 | Yamaguchi | |
| 2017/0040479 A1* | 2/2017 | Tourino | H01L 31/0504 |
| 2018/0062011 A1 | 3/2018 | Crist | |
| 2018/0076761 A1 | 3/2018 | Rehder | |
| 2019/0288638 A1 | 9/2019 | Crocker et al. | |

(Continued)

FOREIGN PATENT DOCUMENTS

CN 108 075 014 A 5/2018

OTHER PUBLICATIONS

Toyoda K et al., "ESD Ground Test of Solar Array Coupons for a Greenhouse Gases Observing Satellite in PEO", IEEE Transactions on Plasma Science, IEEE Service Center, vol. 36, No. 5, Oct. 1, 2008, pp. 2413-2424.

(Continued)

*Primary Examiner* — Christina Chern
(74) *Attorney, Agent, or Firm* — McDonnell Boehnen Hulbert & Berghoff LLP

(57) ABSTRACT

A system of interconnected solar cells is described. The system includes a first solar cell. The system includes a second solar cell adjacent to the first solar cell. The system includes a conductive interconnect configured to conduct electricity between a first terminal of the first solar cell and a second terminal of the second solar cell. The conductive interconnect includes a first end aligned on an axis and configured to conduct electricity at a first terminal on the first solar cell. The conductive interconnect includes a second end aligned on the axis and configured to conduct electricity at a second terminal on the second solar cell. The conductive interconnect includes a center portion connecting the first end to the second end and configured to conduct electricity between the first end and the second end.

20 Claims, 9 Drawing Sheets

(56) References Cited

U.S. PATENT DOCUMENTS

2019/0341514 A1 11/2019 Murali et al.
2020/0044103 A1 2/2020 Tourino et al.

OTHER PUBLICATIONS

Hardingham C et al., "Direct Glassed and Ultrathin GaAS Cells", World Conference on Potovoltaic Energy. waikola, Dec. 5-9, 1994, pp. 2217-2219.
Extended European Search Report prepared by the European Patent Office in application No. EP 21 17 4559.1 dated Nov. 29, 2021.

\* cited by examiner

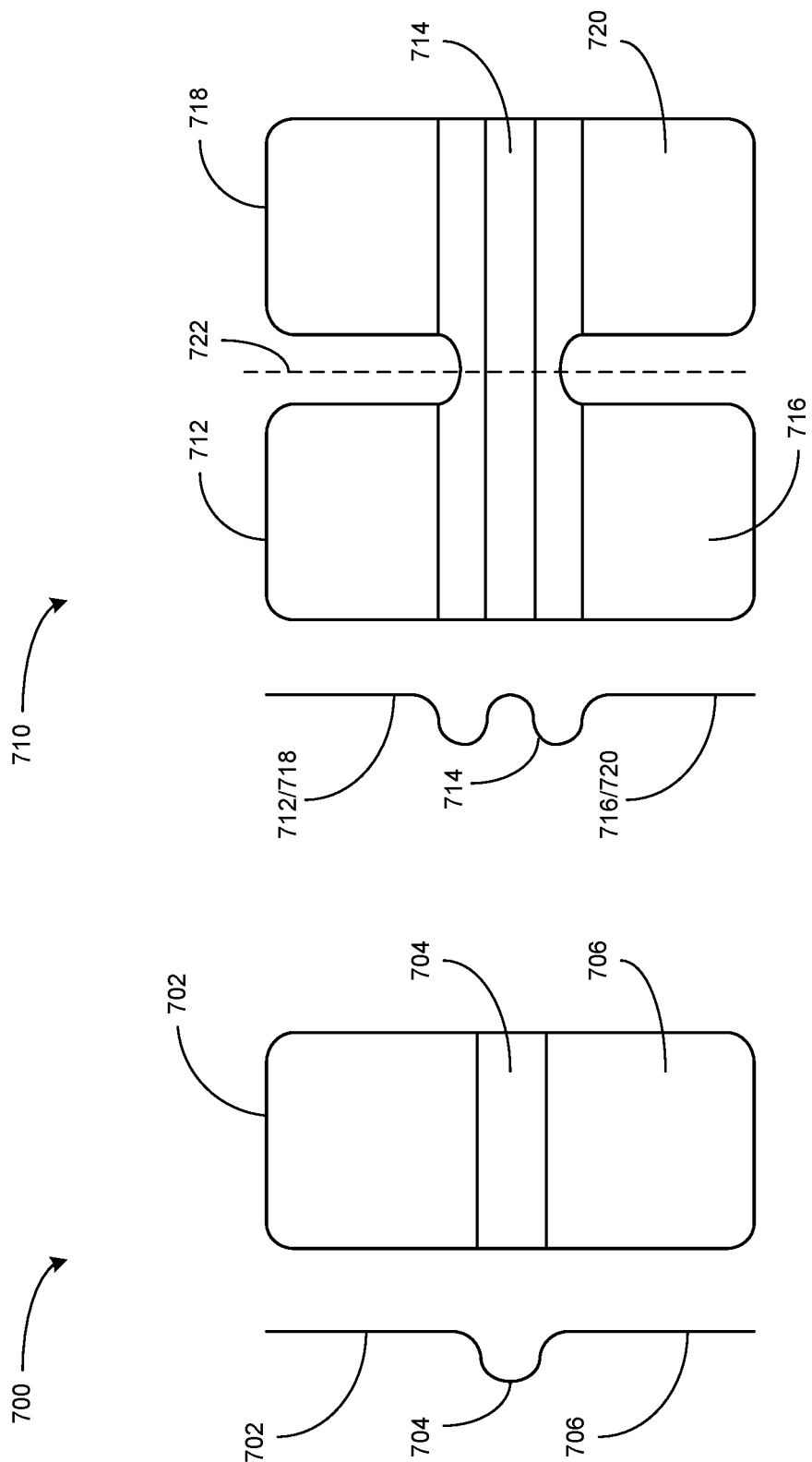

CONDUCTIVE INTERCONNECT FOR CONNECTING ADJACENT SOLAR CELLS IN A SOLAR CELL ASSEMBLY

FIELD

The present disclosure relates generally to forming a solar cell assembly. In particular, the present disclosure relates to using a conductive interconnect for connecting adjacent solar cells in a solar cell assembly.

BACKGROUND

Solar cells are used to transform heat energy from sunlight into electrical energy. In order to increase the energy output of a solar cell system, a plurality of solar cells can be interconnected into a solar cell assembly. The solar cells in the assembly are typically modular to facilitate adaptive configurations. Conductive interconnects are typically used to provide electrical pathways between adjacent solar cells in an assembly.

Assembling the solar cells into a single unit can involve multiple components and several steps. In particular, assembling the solar cells can include welding several different types of interconnects between adjacent solar cells and flipping the entire assembly after welding the interconnects to the adjacent solar cells. These steps can complicate the assembly process and increase the likelihood of damage occurring to the assembly.

What is needed is a system that allows for consistent and timely assembly of solar cells.

SUMMARY

In an example, a conductive interconnect for connecting adjacent solar cells in a solar cell assembly is described. The conductive interconnect includes a first end aligned on an axis and configured to conduct electricity at a first terminal on a first solar cell. The conductive interconnect includes a second end aligned on the axis and configured to conduct electricity at a second terminal on a second solar cell. The conductive interconnect includes a center portion connecting the first end to the second end and configured to conduct electricity between the first end and the second end. The conductive interconnect includes a first concave opening formed by the first end and the center portion, wherein the first concave opening is oriented in a first direction substantially perpendicular to the axis, and wherein the first concave opening is configured to interface with a first edge of the first solar cell. The conductive interconnect includes a second concave opening formed by the second end and the center portion, wherein the second concave opening is oriented in a second direction substantially perpendicular to the axis in an opposite direction relative to the first direction, and wherein the second concave opening is configured to interface with a second edge of the second solar cell.

In another example, a system of interconnected solar cells is described. The system includes a first solar cell. The system includes a second solar cell adjacent to the first solar cell. The system includes a conductive interconnect configured to conduct electricity between a first terminal of the first solar cell and a second terminal of the second solar cell. The conductive interconnect includes a first end aligned on an axis and configured to conduct electricity at a first terminal on the first solar cell. The conductive interconnect includes a second end aligned on the axis and configured to conduct electricity at a second terminal on the second solar cell. The conductive interconnect includes a center portion connecting the first end to the second end and configured to conduct electricity between the first end and the second end. The conductive interconnect includes a first concave opening formed by the first end and the center portion, wherein the first concave opening is oriented in a first direction substantially perpendicular to the axis, and wherein the first concave opening is configured to interface with a first edge of the first solar cell. The conductive interconnect includes a second concave opening formed by the second end and the center portion, wherein the second concave opening is oriented in a second direction substantially perpendicular to the axis in an opposite direction relative to the first direction, and wherein the second concave opening is configured to interface with a second edge of the second solar cell.

In another example, a method of manufacturing a system of interconnected solar cells is described. The method includes connecting a plurality of adjacent pairs of solar cells using a plurality of conductive interconnects. Each pair of adjacent solar cells comprises a first solar cell and a second solar cell. Each conductive interconnect includes a first end aligned on an axis and configured to conduct electricity at a first terminal on a first solar cell. Each conductive interconnect includes a second end aligned on the axis and configured to conduct electricity at a second terminal on a second solar cell. Each conductive interconnect includes a center portion connecting the first end to the second end and configured to conduct electricity between the first end and the second end. Each conductive interconnect includes a first concave opening formed by the first end and the center portion, wherein the first concave opening is oriented in a first direction substantially perpendicular to the axis, and wherein the first concave opening is configured to interface with a first edge of the first solar cell. Each conductive interconnect includes a second concave opening formed by the second end and the center portion, wherein the second concave opening is oriented in a second direction substantially perpendicular to the axis in an opposite direction relative to the first direction, and wherein the second concave opening is configured to interface with a second edge of the second solar cell. Connecting the plurality of adjacent pairs of solar cells using the plurality of conductive interconnects includes welding a first end of each conductive interconnect to a first terminal of a first solar cell and welding a second end of each conductive interconnect to a second terminal of a second solar cell. The method includes, after connecting the plurality of adjacent pairs of solar cells, covering the plurality of solar cells in an enclosure.

The features, functions, and advantages that have been discussed can be achieved independently in various examples or may be combined in yet other examples. Further details of the examples can be seen with reference to the following description and drawings.

BRIEF DESCRIPTION OF THE FIGURES

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying drawings, wherein:

FIG. 7A illustrates a conductive interconnect, according to an example implementation.

FIG. 7B illustrates a conductive interconnect, according to an example implementation.

DETAILED DESCRIPTION

Figure 1:
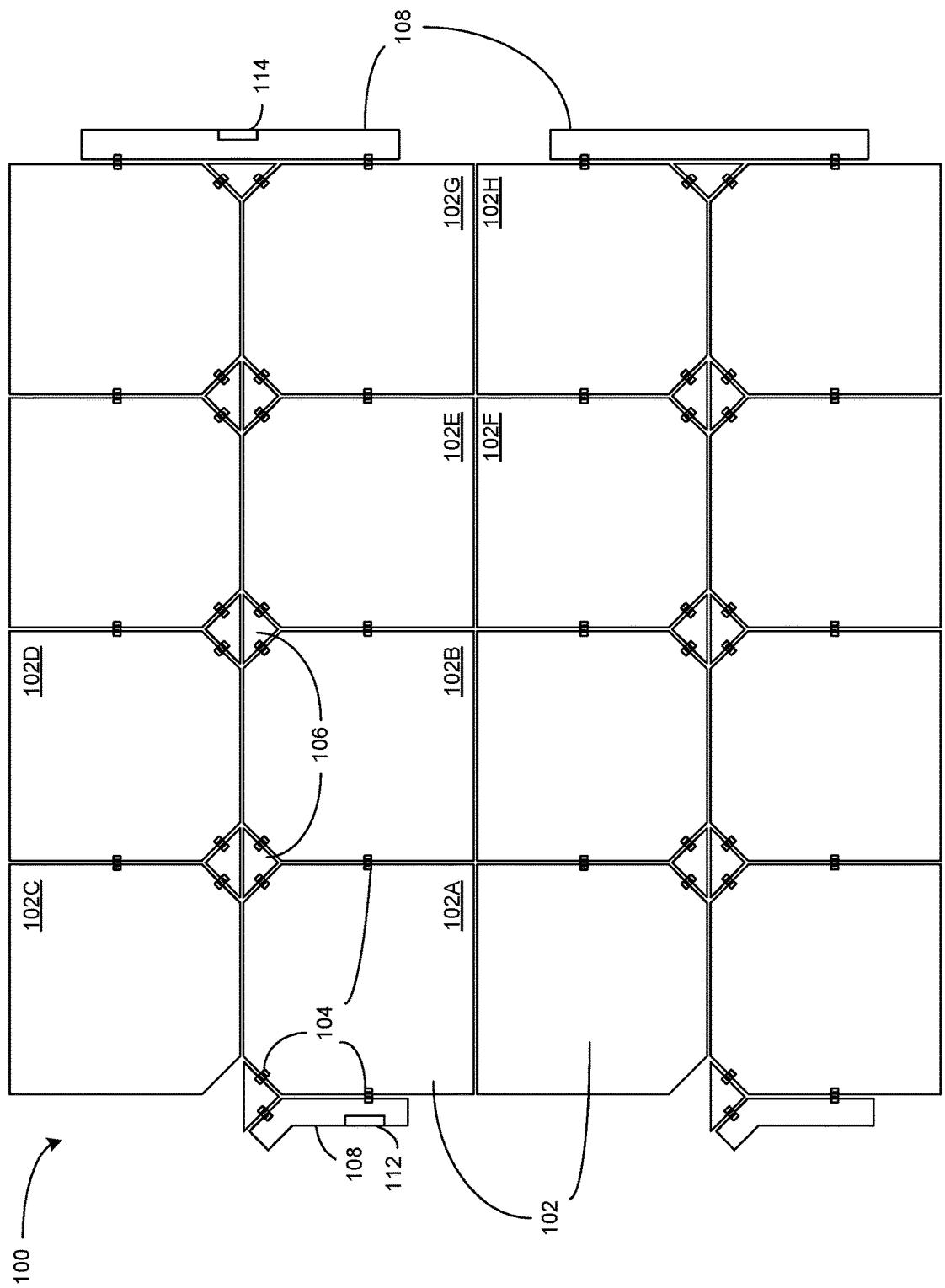
FIG. 1 illustrates a solar cell assembly, according to an example implementation.

Disclosed examples will now be described more fully hereinafter with reference to the accompanying drawings, in which some, but not all of the disclosed examples are shown. Indeed, several different examples may be described and should not be construed as limited to the examples set forth herein. Rather, these examples are described so that this disclosure will be thorough and complete and will fully convey the scope of the disclosure to those skilled in the art.

Example systems and methods for forming a solar cell assembly are described. Within examples, a solar cell assembly is described that includes a plurality of solar cells. Each pair of adjacent solar cells is connected using an interconnect. The interconnect can be a conductive interconnect that allows electricity to flow between the solar cells. Additional input and output ports can be included at the edges of the assembly, and common corners can be provided for sets of adjacent solar cells. Each of these components may also be joined by conductive interconnects.

Within examples, each interconnect has a first end, a second end, and a center portion, the center portion may be configured to partially deform (e.g., extend or contract) to ease assembly of solar cells. As used herein in the context of an interconnect, a "first end" specifies a portion of the interconnect configured to interface with a component, a "second end" specifies a portion of the interconnect configured to interface with another component and disposed opposite the first end on the interconnect, and a "center portion" specifies a portion connecting the first end and the second end. The partially deforming interconnects in this manner may also allow for mechanical movement or thermal expansion/contraction of adjacent solar cells while maintaining a connection between the solar cells. In this manner, a conductive interconnect may continue to provide an electrical connection even when the solar cell assembly undergoes mechanical changes.

Within examples, each of the conductive interconnects is configured in the same manner. This can improve assembly times by simplifying the assembly process. More particularly, each conductive interconnect being the same allows for each type of component in the solar cell assembly to be connected using the same type of conductive interconnect.

Within examples, the conductive interconnects can be provided inplane with the solar cells. In this context, the term "inplane" can refer to orienting the interconnects in a manner that is flush with a surface of the solar cells. Assembling the solar cells in this manner allows for the solar cells to be connected on an solar-facing side of the cells. This allows for the assembly to be covered with an enclosure without flipping the entire assembly. This can reduce assembly times and reduce the likelihood that components will break or become disconnected during assembly Within examples, the conductive interconnects and solar cell terminals are formedin a manner such that the orientation of the interconnect does not impact how the solar cells perform when connected. This also allows for simplified and robust assembly of the solar cells by allowing for either end of an interconnect to connect to either solar cell in an adjacent pair of solar cells.

Within examples, assembly of a plurality of solar cells can include positioning the solar cells adjacently to one another, connecting the solar cells by welding conductive interconnects between them, and providing an enclosure over the solar cells and the conductive interconnects without changing the direction that the solar cells are facing. As used herein in the context of solar cells, the term "adjacent" refers to solar cells that are aligned next to one another with no intermediate solar cells in-between them. This can allow for more reliable assembly of the solar cells by reducing major changes to the system while assembling the solar cells and thereby reducing the likelihood that components become disconnected or damaged during assembly.

Thus, examples are provided herein that generally facilitate quick, robust, and adaptive solar cell assemblies. This can be implemented by configuring the solar cell interconnects and the solar cells in a particular manner, as described further below.

Turning now to the figures, FIG. 1 illustrates a system 100 of interconnected solar cells, according to an example implementation. The solar cell assembly includes a plurality of solar cells 102, a plurality of conductive interconnects 104, a plurality of common corners 106, and a plurality of end tabs 108. A plurality of solar cells can meet at each common corner. For example, as shown in FIG. 1, four adjacent solar cells include a first solar cell 102A, a second solar cell 102B, a third solar cell 102C, and a fourth solar cell 102D. The first solar cell 102A, the second solar cell 102B, the third solar cell 102C, and the fourth solar cell 102D meet at a common corners. As shown in FIG. 1, these components of the solar cell assembly are modular, and can be rearranged removed, or supplemented to create a different configuration having different electrical output properties. For example, an additional set of solar cells could be added to the system 100 of interconnected solar cells.

The plurality of solar cells 102 incudes a plurality of adjacent pairs of solar cells that form an array of solar cells, otherwise referred to as a solar array. For example, a first solar cell 102A and a second solar cell 102B can be considered an adjacent pair of solar cells. A conductive interconnect is provided where the first solar cell 102A and a second solar cell 102B meet. Each adjacent pair includes two solar cells that are aligned along an edge, and can be joined by a respective conductive interconnect. These solar cells can form a plurality of solar strings that are aligned in a row. For example, to form a solar string, a first solar cell can be connected to a second solar cell, the second solar cell can be connect to a third solar cell, and so on such that the solar cells are arranged in a linear manner. Accordingly, each solar cell can be part of a plurality of adjacent pairs, each connected by a conductive interconnect. The conductive interconnect can provide some structural support to the pair of adjacent solar cells, and also provide an electrical pathway between them.

Within examples, the plurality of conductive interconnects 104 can be configured in the same manner for each connection. For example, as shown in FIG. 1, the conductive interconnect that electrically couples each adjacent pair of solar cells is configured substantially identically to the plurality of conductive interconnects that electrically couples each set of four adjacent solar cells that meet at the common corners 106. As used herein in the context of a conductive interconnect, the term "substantially identically" can refer to interconnects that adhere to the same design specifications and include the same shape.

Each of the solar cells has a solar-facing side and a non-solar-facing side. FIG. 1 depicts the solar-facing side of the solar cells. As depicted, the interconnects are disposed on the solar-facing side of each solar cell. From an assembly perspective, this can increase efficiency while reducing overall assembly time by allowing a welder (robotic or manual) to more easily reach each conductive interconnect for welding to a given pair of adjacent solar cells. Assembly can also be simplified using this solar-facing configuration by allowing multiple steps of assembly to be performed on a single work surface. For example, each solar cell of the plurality of solar cells 102, common corners 106, and end tabs 108 end tab can be laid out on the work surface as depicted in FIG. 1. The plurality of conductive interconnects 104 can be positioned at terminals of each of the laid out components. Because the conductive interconnects 104 are positioned on top of the solar-facing side of the components, gravity can hold the conductive interconnects 104 in place prior to welding. Further, after welding the conductive interconnects 104 to the solar cells 102, common corners 106, and end tabs 108, an enclosure can be laid out over all of the components without repositioning or reorienting the system 100 of interconnected solar cells. In this manner, assembly of the system 100 of interconnected solar cells is optimized for expeditious and adaptive manufacture.

The solar cells 102, common corners 106, end tabs 108, and conductive interconnects 104 can collectively form one or more power circuits suitable for connection to a power supply of a power grid. Each conductive interconnect electrically couples two components of the system to allow for current flow between the components. For example, a first connection to the power supply can be established at a terminal 112 of an end tab, a second connection can be established at a terminal 114 of an end tab, and when the plurality of solar cells 102 are exposed to sunlight, electricity can flow between the solar cells 102, common corners 106, end tabs 108, and conductive interconnects 104. The terminal 112 and the terminal 114 associated with the end tabs 108 can be referred to as output terminals, and are disposed at the outer edges of the array of solar cells. The outer edges can be edges of solar cells that are not connected to any adjacent solar cells.

As depicted in FIG. 1, some adjacent pairs of solar cells are not connected by a conductive interconnect. For example, a solar cell 102E and a solar cell 102F are adjacent, but are not connected by an interconnect, and a solar cell 102F and a solar cell 102G are adjacent, but are not connected by an interconnect. Accordingly, multiple distinct power circuits can be established in a single solar assembly to allow for continued power output in the event of a single component failing or requiring maintenance.

Though the interconnects in FIG. 1 are described as being conductive interconnects, it should be understood that more generally the interconnects can serve as mechanical interconnects between adjacent solar cells. Further, though each pair of adjacent solar cells is depicted as being aligned such that they are spaced substantially evenly, such alignment may not be consistent during assembly of the solar cells or after assembly. For example, solar cells may shift relative to one another while being transported, due to wind or other external forces, or due to thermal expansion and contraction. Each interconnect can have a center portion configured to partially deform easing assembly of the solar cells and allowing for mechanical movement or thermal expansion/contraction of adjacent solar cells while maintaining a connection between the solar cells. Deforming the interconnects in this manner also reduce stresses experienced by the solar cells at each terminal due to forces imparted by the interconnects in response to such mechanical movement or thermal changes. The electrical interconnects described with respect to FIG. 1 may also have this adaptive property. In this manner, a conductive interconnect can continue to provide an electrical connection even when solar cells undergo mechanical or thermal changes. In the following Figures, interconnects are sometimes described as conductive interconnects, but it should be understood that these interconnects can be configured similarly without being conductive or without being used to electrically interconnect adjacent solar cells.

FIG. 1 shows each conductive interconnect being configured in the same manner. This can further simplify the assembly process for the system 100 of interconnected solar cells by reducing the number of unique components. Additional details regarding how the plurality of conductive interconnects 104 are configured and how they interface with the plurality of solar cells 102 are provided below.

Figure 2:
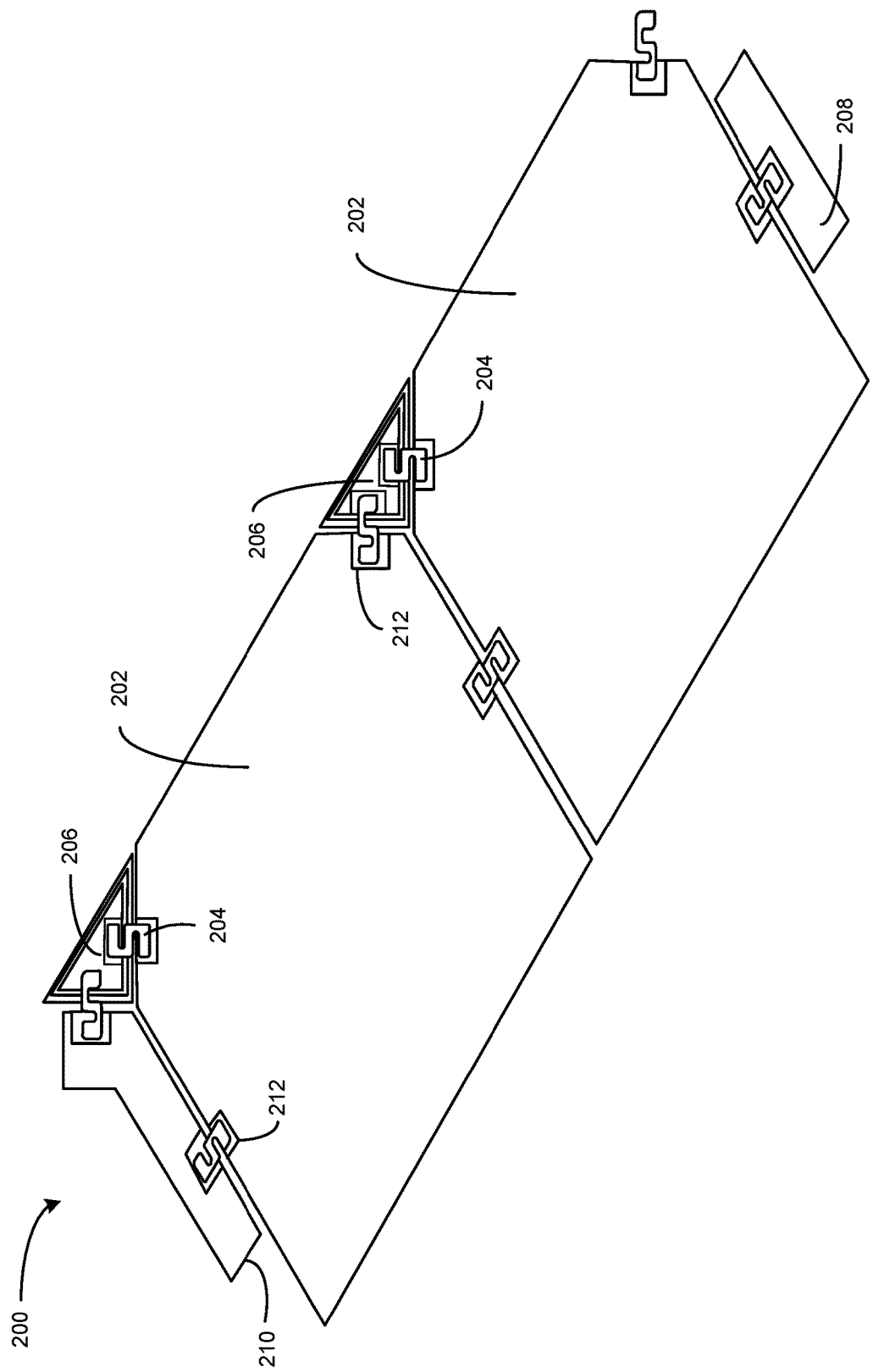
FIG. 2 illustrates a portion of a solar cell assembly, according to an example implementation.

FIG. 2 illustrates a portion of a solar cell assembly 200, according to an example implementation. In particular, FIG. 2 shows a pair of adjacent solar cells 202, a plurality of conductive interconnects 204, a plurality of common corners 206, an end tab 208, and an end tab 210. The plurality of conductive interconnects are configured to interface with solar cells, tabs, and common corners by way of a plurality of terminals 212. The plurality of terminals 212 are each configured to interface with one end of a conductive interconnect, and provide an electrical pathway to another component of the solar cell assembly 200. The system 100 of interconnected solar cells in FIG. 1 and the solar cell assembly 200 in FIG. 2 are configured differently to illustrate that solar cell assemblies can be modular, and can incorporate more or fewer solar cells depending on a desired power output of the solar cell assembly. For purposes of simplicity, some illustrated terminals and interconnects are not labelled in FIG. 2. It should be understood that these terminals and interconnects are configured in a similar manner to the terminals 212 and the conductive interconnects 204 described herein.

Figure 3:
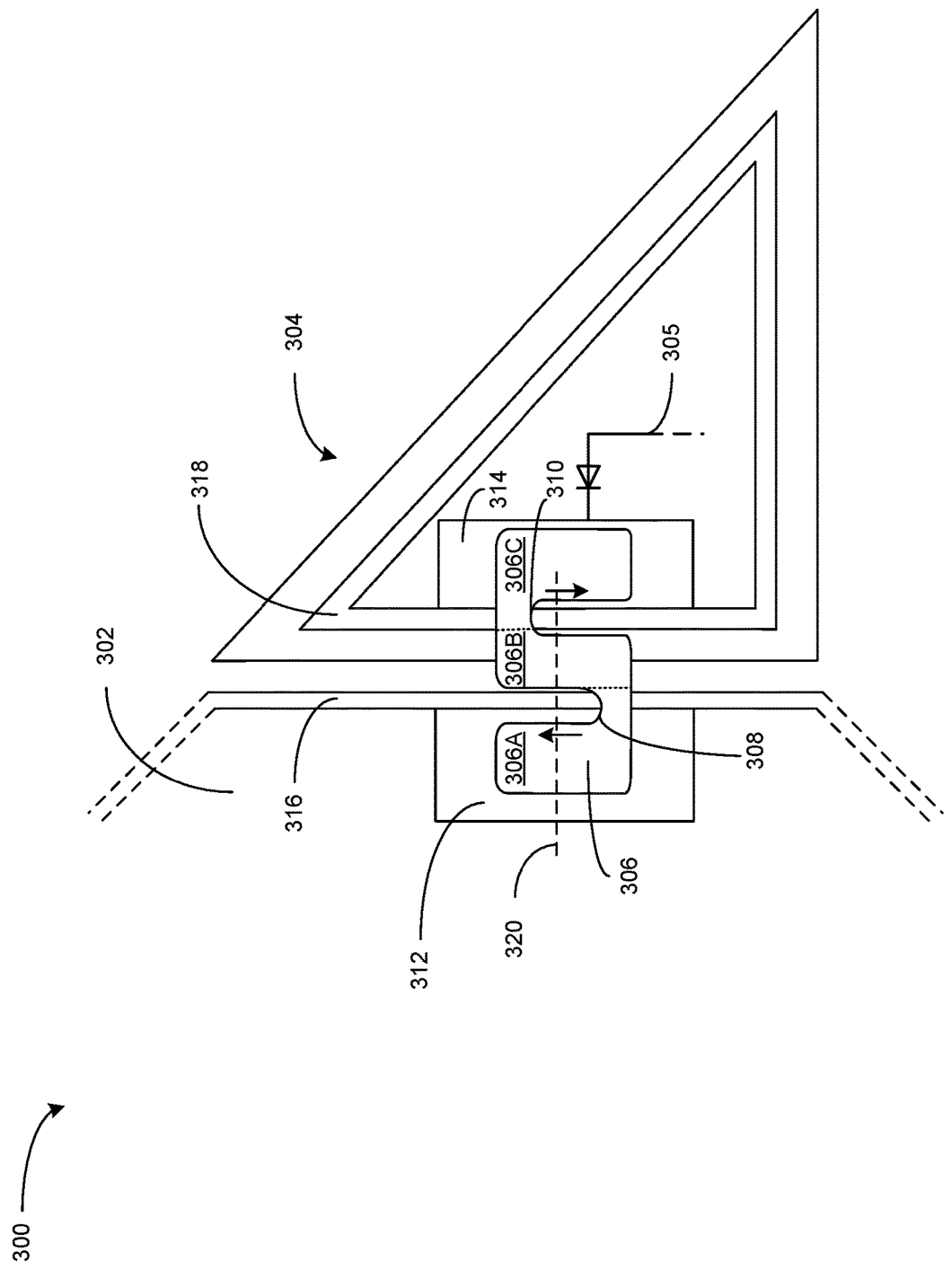
FIG. 3 illustrates a conductive interconnect, according to an example implementation.

FIG. 3 illustrates a conductive interconnect, according to an example implementation. In particular, FIG. 3 shows a close-up view of a conductive interconnect 306 in a solar cell assembly 300. For purposes of illustration, FIG. 3 also shows a solar cell 302, and a common corner 304. The conductive interconnect 306 spans a distance between a first terminal 312, which is part of the solar cell 302, and a second terminal 314, which is part of the common corner 304. The common corner can be shared by a plurality of solar cells, as depicted in FIGS. 1 and 2, and can include one or more diodes configured to direct the flow of electricity between these components. Thus, in some examples, the common corner 304 can include a corner diode 305 that connects to two or more components of a solar cell assembly. The corner diode 305 depicted with a diode symbol indicating that the corner diode 305 allows electricity to flow from the second terminal 314 to the first terminal 312, and not from the first terminal 312 to the second terminal 314. The corner diode 305 can be configured in an opposite orientation as well. Further, the corner diode 305 may include a plurality of diodes corresponding to a plurality of terminals on the common corner 304.

The conductive interconnect 306 includes a first end 306A aligned on an axis 320 and configured to conduct electricity at the first terminal 312 on the solar cell 302. The conductive interconnect 306 includes a second end 306C aligned on the axis 320 and configured to conduct electricity at the second terminal 314 on the common corner 304. The conductive interconnect 306 includes a center portion 306B connecting the first end 306A to the second end 306C and configured to conduct electricity between the first end 306A and the second end 306C. The first end 306A, the center portion 306B, and the second end 306C are illustrated as being separated by dashed lines.

The conductive interconnect 306 further includes a first concave opening 308 formed by the first end 306A and the center portion 306B. The first concave opening 308 is oriented in a first direction (represented by an arrow in FIG. 3) substantially perpendicular to the axis 320, and the first concave opening 308 is configured to interface with a first edge 316 of the solar cell 302. The conductive interconnect 306 further includes a second concave opening 310 formed by the second end 306C and the center portion 306B. The second concave opening 310 is oriented in a second direction (represented by an arrow in FIG. 3) substantially perpendicular to the axis 320 in an opposite direction relative to the first direction, and the second concave opening 310 is configured to interface with a second edge 318 of the common corner 304. Interfacing with the first edge 316 and the second edge 318 can include occupying a notch in each edge or making contact with each edge. For example, interfacing with the first edge 316 and the second edge 318 can involve welding the conductive interconnect 306 to the first edge 316 and the second edge 318.

Though FIG. 2, shows the conductive interconnect 306 spanning a distance between the first terminal 312, which is part of the solar cell 302, and the second terminal 314, which is part of the common corner 304, it should be understood that this distance may change during or after assembly due to mechanical forces or thermal expansion and contraction of one or more solar cells. Accordingly, the center portion 306B may be configured to partially deform to allow for such mechanical or thermal changes to the system. This same property can be applied to multiple interconnects across an entire solar cell assembly, allowing the entire solar cell assembly to undergo mechanical and thermal changes while remaining connected via the interconnects. The interconnects described below with respect to FIGS. 5A-B, 6A-C, and 7A-B may be similarly configured to partially deform to allow for such mechanical and thermal changes to the solar cell assembly.

Though FIG. 3 is depicted as a connection between a solar cell and a common corner, similar connections could be formed between different components, such as between a pair of adjacent solar cells. For example, the second terminal 314 could be located on a second solar cell rather than being located on the common corner 304 as shown in FIG. 3.

Figure 4:
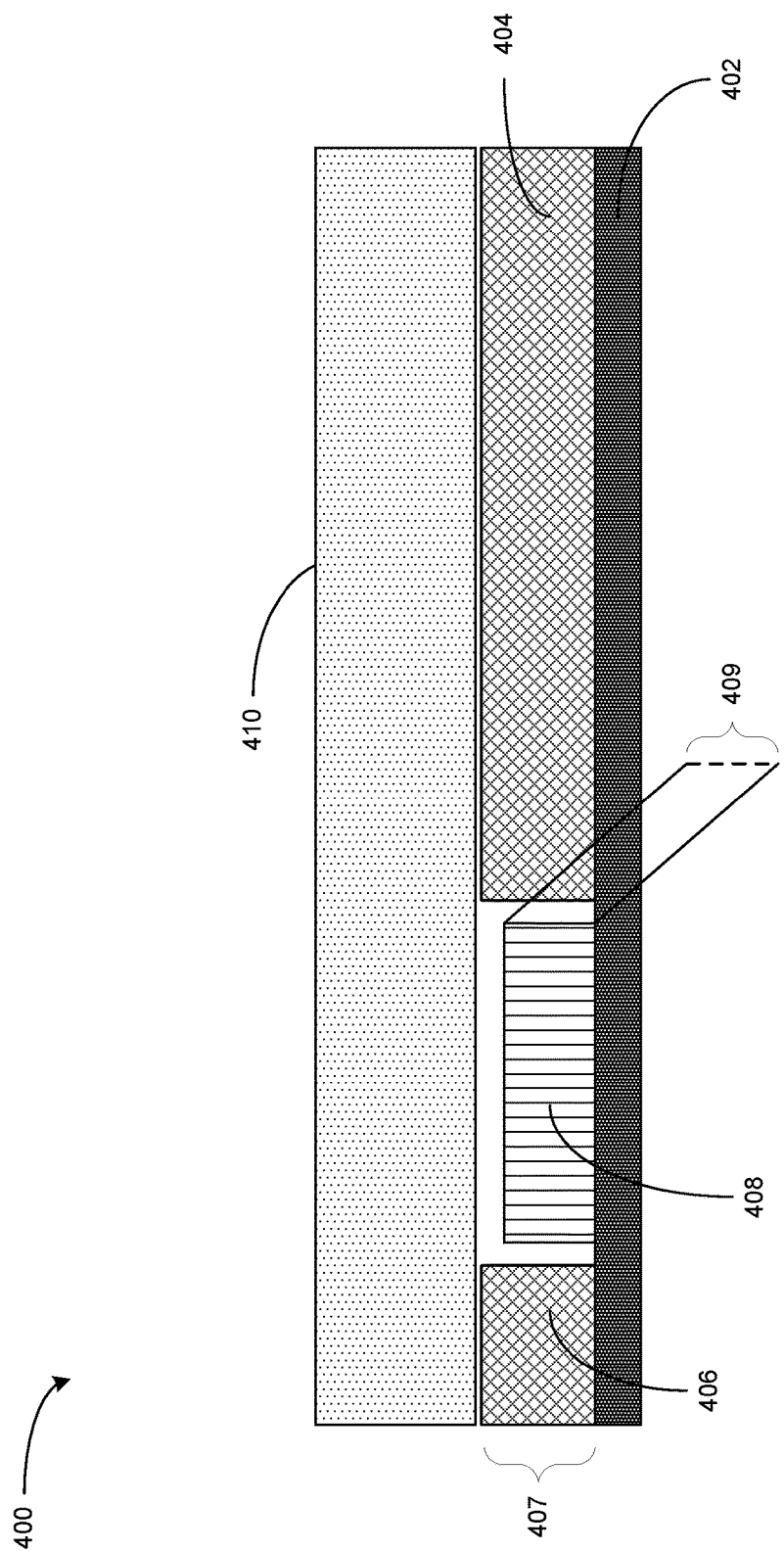
FIG. 4 illustrates a cross-section of an interconnect interfacing with a solar cell, according to an example implementation.

FIG. 4 illustrates a cross-section of an interconnect interfacing with a solar cell, according to an example implementation. In particular, FIG. 4 shows a close-up cross-sectional view of a conductive interconnect 408 in a solar cell assembly 400. The solar cell assembly 400 includes a solar cell 402 having an edge. At the cross-section, the edge is split by a notch that holds a portion of the conductive interconnect 408. The edge has a first portion 404 and a second portion 406, and the conductive interconnect interfaces with the edge in a space between the first portion 404 and the second portion 406. The first portion 404 and the second portion 406 have a first height that can correspond to a terminal on the solar cell 402. The terminal, while not pictured in the cross-sectional view may be a conductive recessed portion of the solar cell 402 that is shaped to accept a portion (e.g., a first end or a second end) of the conductive interconnect 408. The solar cell assembly 400 further includes an enclosure 410 that covers the solar cell, the first portion 404 of the edge and the second portion 406 of the edge, and the conductive interconnect 408. As shown in FIG. 4, there is space surrounding the portion of the conductive interconnect 408, the first portion 404 of the edge, the second portion 406 of the edge, and the enclosure 410. This allows for the conductive interconnect 408 to fit below the enclosure 410, with additional space that may be taken up when welding the conductive interconnect 408 to the terminal on the solar cell 402.

As shown in FIG. 4, the conductive interconnect 408 has a thickness 409 and the edge has a height 407. The height 407 of the edge is greater than the thickness. Further, though not pictured, a terminal of the solar cell 402 may also have a height that is greater than the thickness 409, allowing the enclosure 410 to cover the solar cell 402 without interruption by the conductive interconnect 408. This, in turn, eases assembly of the system of solar cells and allows the enclosure to remain level. For example, the terminal can be aligned with other terminals at a first height, a top surface (e.g. the height of the edge) can be aligned at a second height, and the conductive interconnect 408 can have a thickness that is less than or equal to a height difference between the first height and the second height.

The conductive interconnect 408 is placed in the terminal of the solar cell 402 and welded to the terminal prior to providing the enclosure 410 on top of the conductive interconnect. Each solar cell has a solar-facing side and a non-solar-facing side, and the can be recessed below a top surface of the solar-facing side of the solar cell. Each solar cell in a solar cell assembly can be configured in this manner.

Figure 5B:
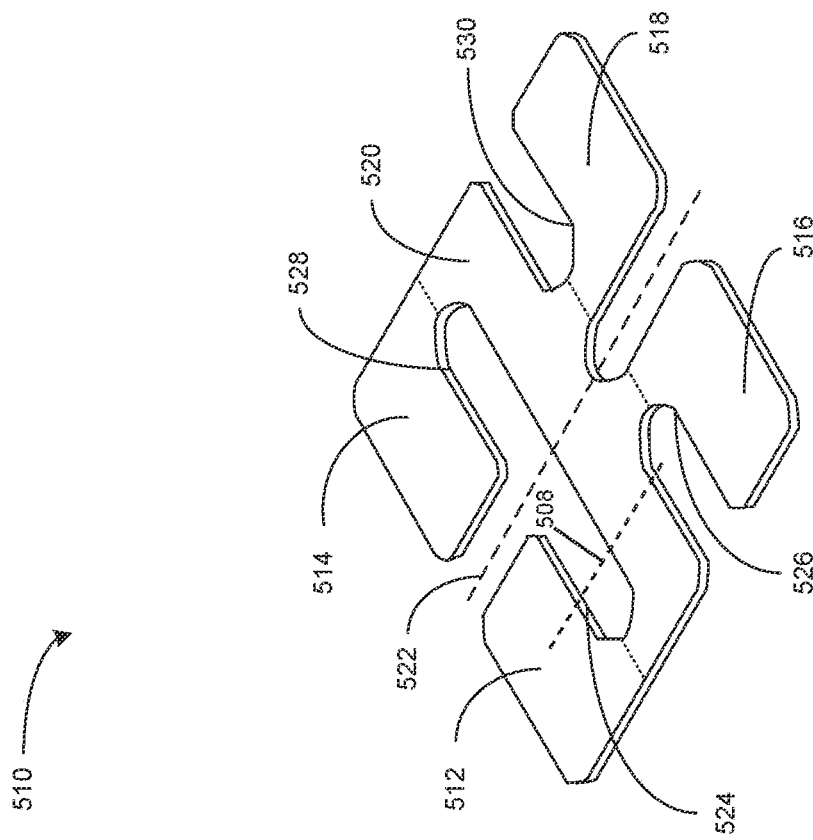
FIG. 5B illustrates a conductive interconnect, according to an example implementation.
Figure 5A:
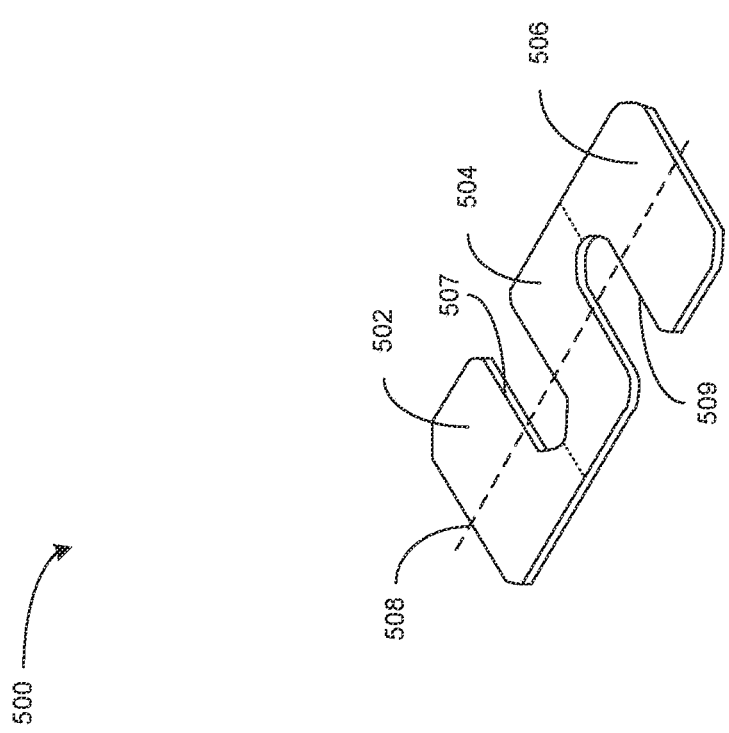
FIG. 5A illustrates a conductive interconnect, according to an example implementation.

FIG. 5A illustrates a conductive interconnect 500, according to an example implementation. In particular, FIG. 5A illustrates a perspective view of the conductive interconnect 500. The conductive interconnect 500 includes a first end 502 aligned on an axis 508. The conductive interconnect 500 also includes a second end 506 aligned on the axis 508. The conductive interconnect 500 also includes a center portion 504 connecting the first end 502 to the second end 506 and configured to conduct electricity between the first end 502 and the second end 506. The first end 502, the center portion 504, and the second end 506 are illustrated as being separated by dashed lines. The first end 502 and the center portion 504 form a first concave opening 507. Further, the second end 506 and the center portion 504 form a second concave opening 509 that faces an opposite direction of the first concave opening 507. Because the first end 502 is a rotated copy of the second end 506, the conductive interconnect 500 can be oriented to align either the first end 502 or the second end 506 with a first terminal and a second terminal respectively, the conductive interconnect 500 can be coupled between the terminals in an adaptive and quick manner.

FIG. 5B illustrates a conductive interconnect 510, according to an example implementation. In particular, FIG. 5B illustrates a perspective view of the conductive interconnect 510. The conductive interconnect can be wherein the configured as two mirrored conductive interconnects (e.g., the conductive interconnect 500) joined at a common center portion. The conductive interconnect 510 includes a first end 512 of the conductive interconnect 510 aligned on an axis 522. The conductive interconnect 510 also includes a second end 516 aligned on the axis 522. The conductive interconnect 510 also includes a center portion 520 connecting the first end 512 to the second end 516 and configured to conduct electricity between the first end 512 and the second end 516. The first end 512, the center portion 520, and the second end 516 are illustrated as being separated by dashed lines. The first end 512 and the center portion 520 form a first concave opening 524. Further, the second end 516 and the center portion 520 form a second concave opening 526 that faces an opposite direction of the first concave opening 524.

The conductive interconnect 510 further includes a third end 514 that is aligned with the first end 512 across the axis 522. The conductive interconnect 510 further includes a fourth end 518 that is aligned with the second end 516 across the axis 522. The third end 514 and the center portion 520 form a third concave opening 528 that mirrors the first concave opening 524. Further, the fourth end 518 and the center portion 520 form a fourth concave opening 530 that faces an opposite direction of the second concave opening 526 and the third concave opening 528.

The first end 512 and the third end 514 may interface with a first edge of a first terminal and may be configured to conduct electricity at the first terminal (e.g., first terminal 312). The second end 516 and the fourth end 518 may interface with a second edge of a second terminal and may be configured to conduct electricity at a second terminal (e.g., second terminal 314). The first end 512 and the third end 514 provide two points of contact at the first terminal, and the second end 516 and the fourth end 518 provide two points of contact at the second terminal. In this manner, if a single end fails to conduct electricity, another end can conduct electricity to the next terminal. Thus, the conductive interconnect 610 provides a robust source of electrical conductivity between two terminals. The conductive interconnect 510 eases assembly of a system of solar cells in a similar manner as that of the conductive interconnect 500. In addition, the conductive interconnect 510 also provides a robust connection between different components that allows electricity to flow even if in the event of a partial failure by providing multiple points of contact at each terminal.

Figure 6C:
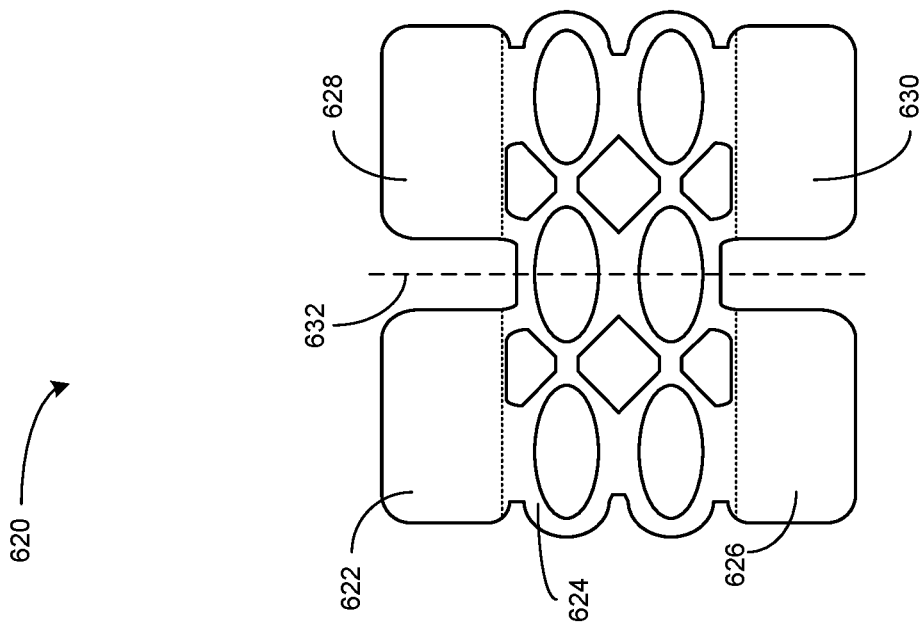
FIG. 6C illustrates a conductive interconnect, according to an example implementation.
Figure 6B:
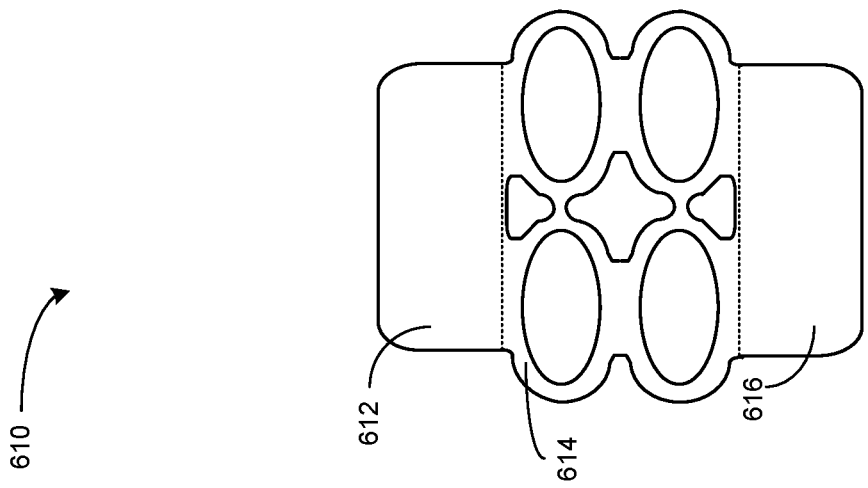
FIG. 6B illustrates a conductive interconnect, according to an example implementation.
Figure 6A:
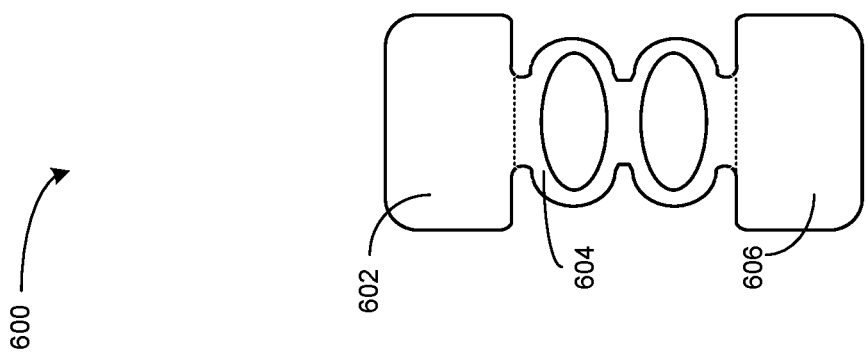
FIG. 6A illustrates a conductive interconnect, according to an example implementation.

FIG. 6A illustrates a conductive interconnect 600, according to an example implementation. In particular, FIG. 6A illustrates a top view of the conductive interconnect 600. The conductive interconnect 600 includes a first end 602. The conductive interconnect 600 also includes a second end 606. The conductive interconnect 600 also includes a center portion 604 connecting the first end 602 to the second end 606 and configured to conduct electricity between the first end 602 and the second end 606. The first end 602, the center portion 604, and the second end 606 are illustrated as being separated by dashed lines. The center portion 604 includes a mesh framework for electricity to flow between the first end 602 and a second end 606. The mesh includes a plurality of intersecting current paths. Accordingly, if a first current path fails to conduct electricity, another current path can still successfully conduct electricity. Further, having a plurality of relatively thin current paths allows for center portion 604 that is flexible. Thus, the conductive interconnect 600 can interface with an edge of a terminal without the edge having a notch.

FIG. 6B illustrates a conductive interconnect 610, according to an example implementation. In particular, FIG. 6B illustrates a top view of the conductive interconnect 610. The conductive interconnect 610 includes a first end 612. The conductive interconnect 610 also includes a second end 616. The conductive interconnect 610 also includes a center portion 614 connecting the first end 612 to the second end 616 and configured to conduct electricity between the first end 612 and the second end 616. The first end 612, the center portion 614, and the second end 616 are illustrated as being separated by dashed lines. The center portion 614 includes a mesh framework for electricity to flow between the first end 612 and a second end 616. The mesh includes a plurality of intersecting current paths. As shown in FIGS. 6A and 6B, the conductive interconnect 610 includes more current paths than the conductive interconnect 600. Accordingly, if a first current path fails to conduct electricity, additional current paths can still successfully conduct electricity. The conductive interconnect 610 is also depicted as being wider than the conductive interconnect 600. Accordingly, the conductive interconnect 600 might be configured for a first type of terminal having a first width, and the conductive interconnect 610 might be configured for a second type of terminal having a second width.

FIG. 6C illustrates a conductive interconnect 620, according to an example implementation. In particular, FIG. 6C illustrates a top view of the conductive interconnect 620. The conductive interconnect 620 includes a first end 622 aligned on an axis 632. The conductive interconnect 620 also includes a second end 626 aligned on the axis 632. The conductive interconnect 620 also includes a center portion 624 connecting the first end 622 to the second end 626 and configured to conduct electricity between the first end 622 and the second end 626. The first end 622, the center portion 624, and the second end 626 are illustrated as being separated by dashed lines. The center portion 624 includes a mesh framework for electricity to flow between the first end 622 and a second end 626.

The conductive interconnect 620 further includes a third end 628 that is aligned with the first end 622 across the axis 632. The conductive interconnect 620 further includes a fourth end 630 that is aligned with the second end 626 across the axis 632. The center portion 624 connects the third end 628 to the fourth end 630 and is configured to conduct electricity between the third end 628 and the fourth end 630. Because the first end 622 and the third end 628 are physically separated, each end can be attached to a different terminal. Accordingly, both the second end 626 and the fourth end 630 can receive electric current from either the first terminal or the second terminal, and vice versa.

FIG. 7A illustrates a conductive interconnect 700, according to an example implementation. In particular, FIG. 7A illustrates a side view and a top view of the conductive interconnect 700. The conductive interconnect 700 includes a first end 702. The conductive interconnect 700 also includes a second end 706. The conductive interconnect 700 also includes a center portion 704 connecting the first end 702 to the second end 706 and configured to conduct electricity between the first end 702 and the second end 706.

The center portion 704 includes a curved portion configured to interface with an edge, such as an edge of a solar cell. For example, the curved portion may have a diameter similar to the width of an edge, allowing the conductive interconnect 700 to pass over the edge to a terminal of the solar cell. In this manner, the conductive interconnect 700 may connect the first end 702 to a first terminal and the second end 706 to a second terminal without interfacing with a notch in the edge.

FIG. 7B illustrates a conductive interconnect 710, according to an example implementation. In particular, FIG. 7B illustrates a side view and a top view of the conductive interconnect 710. The conductive interconnect 710 includes a first end 712 aligned on an axis 722. The conductive interconnect 710 also includes a second end 716 aligned on the axis 722. The conductive interconnect 710 also includes a center portion 714 connecting the first end 712 to the second end 716 and configured to conduct electricity between the first end 712 and the second end 716. The center portion 714 includes two curved portions configured to interface with two edges. In this manner, the conductive interconnect 710 may connect the first end 712 to a first terminal and the second end 716 to a second terminal without interfacing with a notch in the edge.

The conductive interconnect 710 further includes a third end 718 that is aligned with the first end 712 across the axis 722. The conductive interconnect 710 further includes a fourth end 720 that is aligned with the second end 716 across the axis 722. The center portion 714 connects the third end 718 to the fourth end 720 and is configured to conduct electricity between the third end 718 and the fourth end 720. Because the first end 712 and the third end 718 are physically separated, each end can be attached to a different terminal. Accordingly, both the second end 716 and the fourth end 720 can receive electric current from either the first terminal or the second terminal, and vice versa.

Though, in some examples, a single type of conductive interconnect can be used to increase the modularity of the solar cell assembly and to facilitate a quick manufacturing process, in some examples a plurality of types of interconnects can be used. For example, a first conductive interconnect in the system can be a first type (e.g., configured as the conductive interconnect 500) of a plurality of types of conductive interconnects, and a second conductive interconnect of a second type (e.g., configured as the conductive interconnect 510).

The interconnects illustrated in FIGS. 5A-7B show different configurations for use in connecting solar cells in a system. In general, these in interconnects for connecting adjacent solar cells in a solar cell assembly include a first end configured to conduct electricity at a first terminal on a first solar cell, a second end and configured to conduct electricity at a second terminal on a second solar cell, and a center portion connecting the first end to the second end and configured to conduct electricity between the first end and the second end. The center portion is configured to mechanically deform to ease assembly of the solar cells and to allow the solar cells to remain connected when the system changes due to thermal or mechanical forces. Where the interconnects are conductive interconnects as described above, this may further allow electricity to flow between different solar cells during changing conditions of the system. Further, the described interconnects are aligned across one or more axes, easing assembly of a solar cell system by allowing either end of the interconnect to be connected to any terminal.

Figure 8:
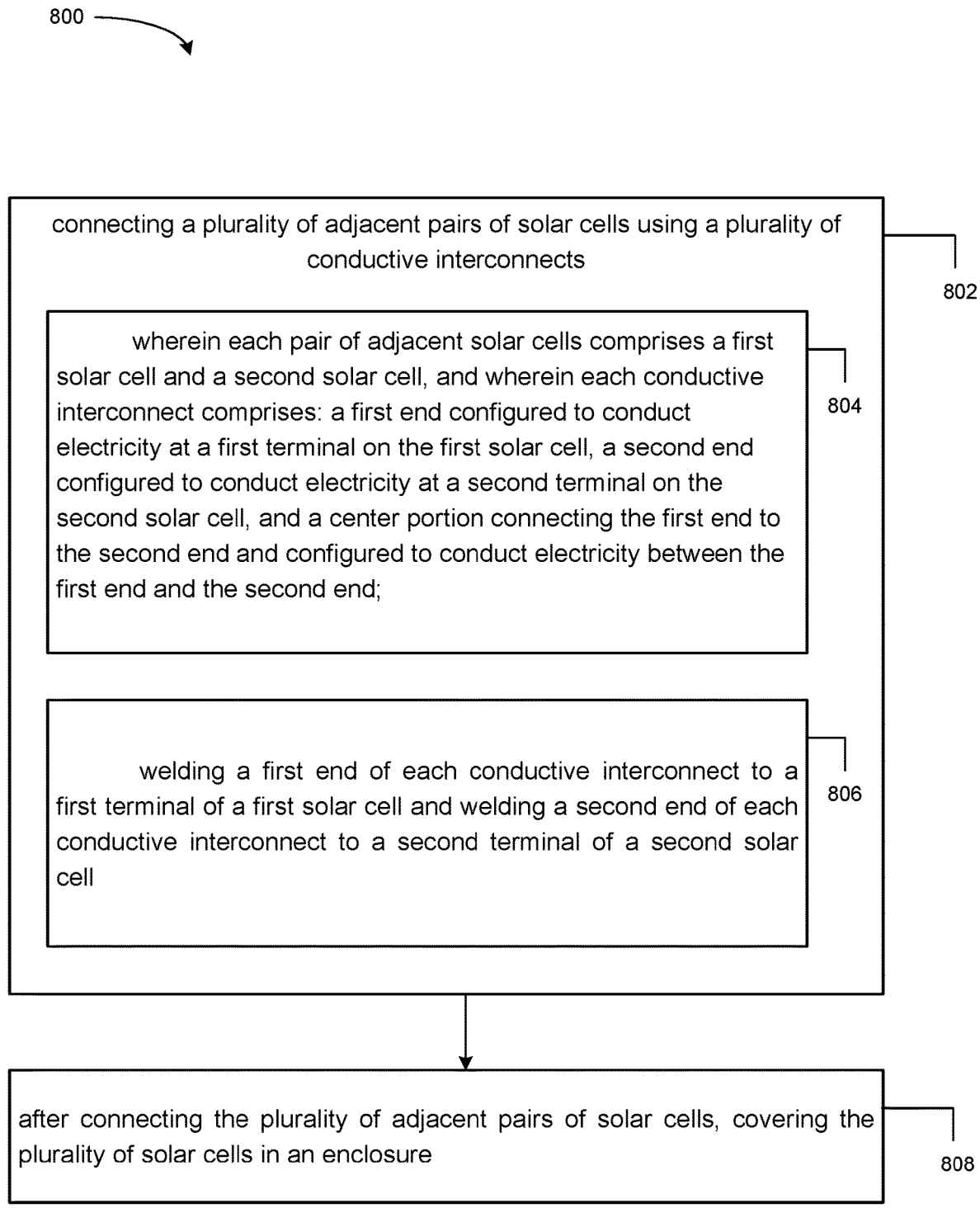
FIG. 8 illustrates a flowchart of a method for manufacturing a system of interconnected solar cells, according to an example implementation.

FIG. 8 illustrates a flowchart of a method 800 of manufacturing a system of interconnected solar cells, according to an example implementation. Method 800 shown in FIG. 8 presents an example of a method that could be used with the system 100, the solar cell assembly 200, 300, and 400, and the conductive interconnects 500, 510, 600, 610, 620, 700, and 710, shown in FIGS. 1-7, a combination thereof, or with components of thereof. Further, the functions described with respect to FIG. 8 may be supplemented by, replaced by, or combined with functions described above with respect to FIGS. 1-7. Further, devices or systems may be used or configured to perform logical functions presented in FIG. 8.

In some instances, components of the devices and/or systems may be configured to perform the functions such that the components are actually configured and structured (with hardware and/or software) to enable such performance. In other examples, components of the devices and/or systems may be arranged to be adapted to, capable of, or suited for performing the functions, such as when operated in a specific manner. Method 800 may include one or more operations, functions, or actions as illustrated by one or more of blocks 802-808. Further, blocks 810-812 of the method 800 may be performed in accordance with one or more of block 802-808. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

It should be understood that for this and other processes and methods disclosed herein, flowcharts show functionality and operation of one possible implementation of present examples. In this regard, each block or portions of each block may represent a module, a segment, or a portion of program code, which includes one or more instructions executable by a processor for implementing specific logical functions or steps in the process. The program code may be stored on any type of computer readable medium or data storage, for example, such as a storage device including a disk or hard drive. Further, the program code can be encoded on a computer-readable storage media in a machine-readable format, or on other non-transitory media or articles of manufacture. The computer readable medium may include non-transitory computer readable medium or memory, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a tangible computer readable storage medium, for example.

In addition, each block or portions of each block in FIG. 8, and within other processes and methods disclosed herein, may represent circuitry that is wired to perform the specific logical functions in the process. Alternative implementations are included within the scope of the examples of the present disclosure in which functions may be executed out of order from that shown or discussed, including substantially concurrent or in reverse order, depending on the functionality involved, as would be understood by those reasonably skilled in the art.

Within examples, one or more blocks of the method 800 may be represented in program code or circuitry used for controlling robotic mechanisms for assembling a system of interconnected solar cells, such as a solar cell assembly.

While method 800 and variations thereof may be executed automatically using, for example, one or more robotic armatures controlled by program code operating in accordance with the method 800, some tasks may be performed manually. Thus, within examples, certain functionality described with respect to the method 800 may be performed automatically while other portions can be performed manually. Alternatively, all blocks of the method 800 may be performed automatically or all blocks of the method 800 may be performed manually.

At block 802, the method 800 includes connecting a plurality of adjacent pairs of solar cells 102 using a plurality of conductive interconnects 104. Each pair of adjacent solar cells includes a first solar cell 102A and a second solar cell 102B.

Block 804 delineates aspects of each conductive interconnect in block 802. At block 804, each conductive interconnect 306 includes a first end 306A aligned on an axis 320 and configured to conduct electricity at a first terminal 312 on the first solar cell 102A, a second end 306C aligned on the axis 320 and configured to conduct electricity at a second terminal 314 on the second solar cell 102B, and a center portion 306B connecting the first end 306A to the second end 306C and configured to conduct electricity between the first end 306A and the second end 306C. Each conductive interconnect 306 further includes a first concave opening 308 opening formed by the first end 306A and the center portion 306B. The first concave opening 308 is oriented in a first direction substantially perpendicular to the axis 320, and the first concave opening 308 is configured to interface with a first edge 316 of the first solar cell 102A. Each conductive interconnect 306 further includes a second concave opening 310 formed by the second end 306C and the center portion 306B. The second concave opening 310 is oriented in a second direction substantially perpendicular to the axis 320 in an opposite direction relative to the first direction, and the second concave opening 310 is configured to interface with a second edge 318 of the second solar cell 102B. Though block 804 corresponds to the conductive interconnects shown in FIGS. 1-4, it should be understood that block 804, and method 800 more generally, can be implemented using the conductive interconnects shown in FIGS. 5A-7B, or other configurations of conductive interconnects.

Block 806 delineates aspects of connecting the plurality of adjacent pairs of solar cells in block 802. At block 806, connecting the plurality of adjacent pairs of solar cells 102 using the plurality of conductive interconnects 104 includes welding a first end 306A of each conductive interconnect to a first terminal 312 of a first solar cell 102A and welding a second end 306C of each conductive interconnect to a second terminal 314 of a second solar cell 102B.

At block 808, method 800 includes, after connecting the plurality of adjacent pairs of solar cells, covering the plurality of solar cells in an enclosure 410.

Figure 9:
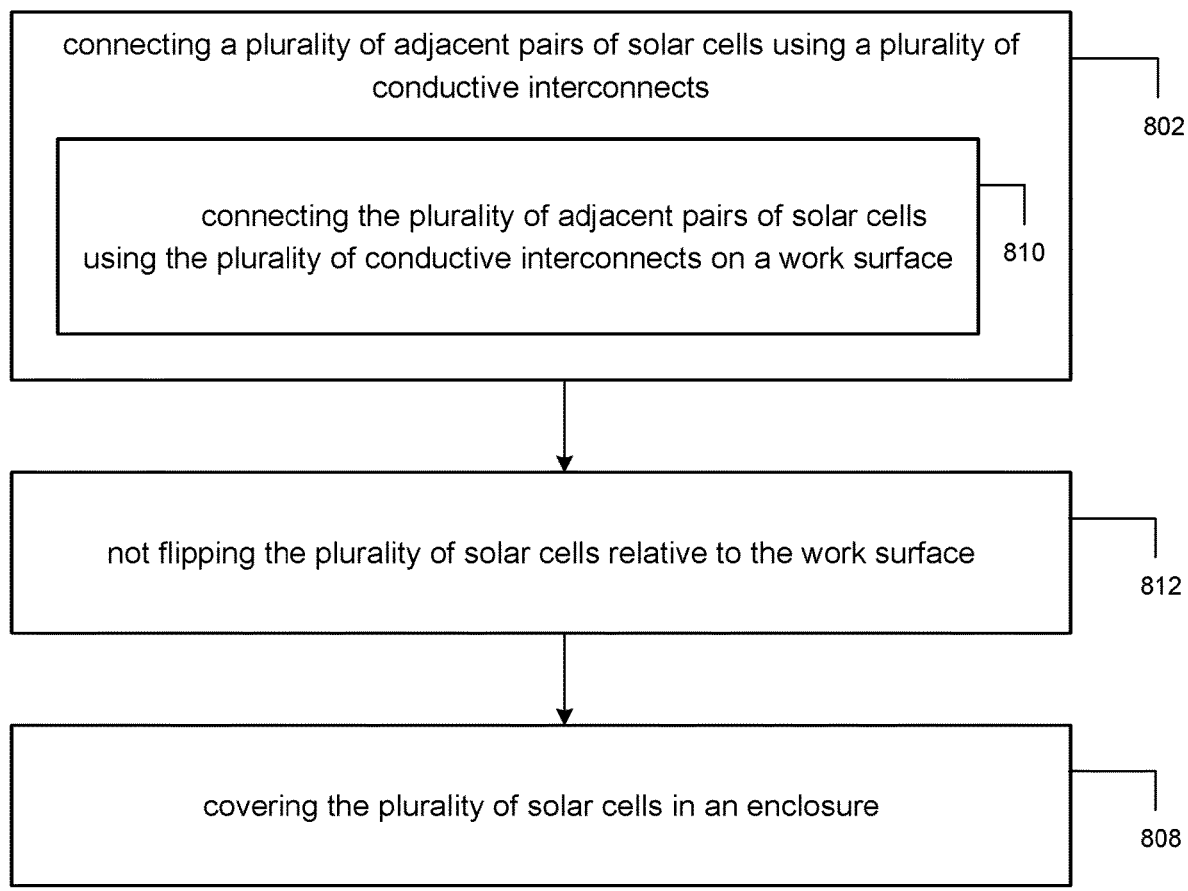
FIG. 9 illustrates a flowchart of a method for use with the method shown in FIG. 8, according to an example implementation.

FIG. 9 illustrates a flowchart of a method for use with the method shown in FIG. 8, according to an example implementation. In particular, FIG. 9 includes blocks 810 and 812. Block 810 is performed in accordance with block 810. At block 810, method 800 includes connecting the plurality of adjacent pairs of solar cells 102 using the plurality of conductive interconnects 104 on a work surface. At block 812, method 800 includes, between connecting the plurality of adjacent pairs of solar cells using the plurality of conductive interconnects as shown at block 802 and covering the plurality of solar cells in an enclosure as shown at block 808, the plurality of solar cells are not flipped relative to the work surface. For example, each conductive interconnect can be placed on a solar-facing side of a solar cell during assembly, allowing the assembly not to be repositioned during the manufacturing process of method 800.

Thus, the methods and systems described herein provide for a system of interconnected solar cells that can be assembled quickly and adaptively. In particular, having conductive interconnects that are in-plane with the solar cells allows an enclosure to be provided over each component of the system without the solar cells being repositioned or flipped, allowing for a quick and adaptive manufacturing process.

As noted above, though conductive interconnects are described herein, it should be understood that interconnects (e.g., non-conductive interconnects) may alternatively be used to mechanically connect adjacent solar cells without providing an electrical connection. Accordingly, methods of mechanically connecting adjacent solar cells may be implemented in a similar manner to method 800 described with respect to FIGS. 8 and 9.

By the term "substantially," "similarity," and "about" used herein, it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Different examples of the system(s), device(s), and method(s) disclosed herein include a variety of components, features, and functionalities. It should be understood that the various examples of the system(s), device(s), and method(s) disclosed herein may include any of the components, features, and functionalities of any of the other examples of the system(s), device(s), and method(s) disclosed herein in any combination or any sub-combination, and all of such possibilities are intended to be within the scope of the disclosure.

The description of the different advantageous arrangements has been presented for purposes of illustration and description, and is not intended to be exhaustive or limited to the examples in the form disclosed. Many modifications and variations will be apparent to those of ordinary skill in the art. Further, different advantageous examples may describe different advantages as compared to other advantageous examples. The example or examples selected are chosen and described in order to best explain the principles of the examples, the practical application, and to enable others of ordinary skill in the art to understand the disclosure for various examples with various modifications as are suited to the particular use contemplated.

What is claimed is:

1. A conductive interconnect comprising:
a first end configured to conduct electricity at a first terminal of a first solar cell; and
a second end configured to conduct electricity at a second terminal of a second solar cell, wherein the first end and the second end are aligned on a first axis;
a center portion connecting the first end to the second end and configured to conduct electricity between the first end and the second end;
a first concave opening formed by a first concave surface of the first end and the center portion, wherein the first concave opening is oriented in a first direction substantially perpendicular to the first axis, and wherein the first concave surface is configured to directly and physically contact a first edge of the first solar cell such that the conductive interconnect can conduct electricity between the first terminal of the first solar cell and the second terminal of the second solar cell; and a second concave opening formed by a second concave surface of the second end and the center portion, wherein the second concave opening is oriented in a second direction substantially perpendicular to the first axis opposite the first direction, and wherein the second concave surface is configured to directly and physically contact a second edge of the second solar cell such that the conductive interconnect can conduct electricity between the first terminal of the first solar cell and the second terminal of the second solar cell.

2. The conductive interconnect of claim 1, further comprising:

a third end configured to conduct electricity at the first terminal, wherein the first end and the third end are aligned across a second axis;

a fourth end configured to conduct electricity at the second terminal, wherein the second end and the fourth end are aligned across the second axis;

a third concave opening formed by the third end and the center portion, wherein the third concave opening is oriented in a third direction substantially perpendicular to the second axis, and wherein the third concave opening is configured to directly and physically contact the first edge of the first solar cell; and a fourth concave opening formed by the fourth end and the center portion, wherein the fourth concave opening is oriented in a fourth direction substantially perpendicular to the second axis in an opposite direction relative to the third direction, and wherein the fourth concave opening is configured to directly and physically contact the second edge of the second solar cell.

3. The conductive interconnect of claim 2, wherein the first direction is oriented in an opposite direction relative to the third direction, and wherein the second direction is oriented in an opposite direction relative to the fourth direction.

4. A system comprising:

a first solar cell;

a second solar cell adjacent to the first solar cell; and a conductive interconnect configured to conduct electricity between a first terminal of the first solar cell and a second terminal of the second solar cell, wherein the conductive interconnect comprises:

a first end configured to conduct electricity at the first terminal of the first solar cell;

a second end configured to conduct electricity at the second terminal of the second solar cell, wherein the first end and the second end are aligned on a first axis;

a center portion connecting the first end to the second end and configured to conduct electricity between the first end and the second end a first concave opening formed by a first concave surface of the first end and the center portion, wherein the first concave opening is oriented in a first direction substantially perpendicular to the first axis, and wherein the first concave surface directly and physically contacts a first edge of the first solar cell; and a second concave opening formed by a second concave surface of the second end and the center portion, wherein the second concave opening is oriented in a second direction substantially perpendicular to the first axis opposite the first direction, and wherein the second concave surface directly and physically contacts a second edge of the second solar cell.

5. The system of claim 4, wherein the conductive interconnect further comprises:

a third end configured to conduct electricity at the first terminal, wherein the first end and the third end are aligned across a second axis;

a fourth end configured to conduct electricity at the second terminal, wherein the second end and the fourth end are aligned across the second axis;

a third concave opening formed by the third end and the center portion, wherein the third concave opening is oriented in a third direction substantially perpendicular to the second axis, and wherein the third concave opening is configured to directly and physically contact the first edge of the first solar cell; and a fourth concave opening formed by the fourth end and the center portion, wherein the fourth concave opening is oriented in a fourth direction substantially perpendicular to the second axis in an opposite direction relative to the third direction, and wherein the fourth concave opening is configured to directly and physically contact the second edge of the second solar cell.

6. The system of claim 5, wherein the first direction is oriented in an opposite direction relative to the third direction, and wherein the second direction of the second concave opening is oriented in an opposite direction relative to the fourth direction.

7. The system of claim 5, wherein the first end and the third end each provide a point of contact at the first terminal, and wherein the second end and the fourth end each provide a point of contact at the second terminal.

8. The system of claim 4, wherein the first terminal comprises a first notch in the first edge, wherein a portion of the first end is received within the first notch, wherein the second terminal comprises a second notch in the second edge, and wherein a portion of the second end is received within the second notch.

9. The system of claim 4, wherein the conductive interconnect is a first conductive interconnect, wherein the first conductive interconnect is a first type, the system further comprising:

a second conductive interconnect of a second type, wherein the second type is configured as two mirrored conductive interconnects of the first type joined at a second center portion.

10. The system of claim 4, wherein the first solar cell and the second solar cell each have a solar-facing side and a non-solar-facing side, wherein the first terminal is recessed below a top surface of the solar-facing side of the first solar cell, and wherein the second terminal is recessed below a top surface of the solar-facing side of the second solar cell.

11. The system of claim 10, wherein the first terminal and the second terminal are aligned at a first height, wherein the top surface of the first solar cell and the top surface of the second solar cell are aligned at a second height, and wherein the conductive interconnect has a thickness that is less than or equal to a height difference between the first height and the second height.

12. The system of claim 4, wherein the conductive interconnect is a first interconnect of a plurality of interconnects, wherein the first solar cell and the second solar cell are part of an array of solar cells, and wherein each of the plurality of interconnects is disposed on a solar-facing side of a pair of adjacent solar cells in the array of solar cells.

13. The system of claim 4, wherein the conductive interconnect is a first interconnect of a plurality of interconnects, wherein the first solar cell and the second solar cell are part of a first solar string, wherein each pair of adjacent solar cells in the first solar string is connected by a respective conductive interconnect, and wherein the system further comprises a plurality of solar strings interconnected with the first solar string.

14. The system of claim 13, further comprising:
a third solar cell aligned with the first solar cell;
a fourth solar cell adjacent to the third solar cell and aligned with the second solar cell, wherein the third solar cell and the fourth solar cell are part of a second solar string, and wherein the first solar cell, the second solar cell, the third solar cell, and the fourth solar cell meet at a common corner; and
a corner diode disposed at the common corner, wherein a plurality of conductive interconnects conducts electricity between the first solar cell, the second solar cell, the third solar cell, and the fourth solar cell.

15. The system of claim 14, wherein the first solar cell, the second solar cell, the third solar cell, and the fourth solar cell are part of an array of solar cells, wherein the array of solar cells comprises:
a plurality of adjacent pairs of solar cells; and
a plurality of sets of four adjacent solar cells, wherein each set of four adjacent solar cells comprises a common corner, wherein a corner diode is disposed at each common corner,
wherein a conductive interconnect electrically couples each adjacent pair of solar cells,
wherein a plurality of conductive interconnects electrically couples each set of four adjacent solar cells, and
wherein the conductive interconnect that electrically couples each adjacent pair of solar cells is configured substantially identically to the plurality of conductive interconnects that electrically couples each set of four adjacent solar cells.

16. The system of claim 15, further comprising a plurality of output terminals disposed at one or more outer edges of the array of solar cells, wherein a conductive interconnect electrically couples each output terminal to an adjacent solar cell in the array of solar cells, and
wherein the conductive interconnect that electrically couples each output terminal to an adjacent solar cell is configured substantially identically to the conductive interconnect that electrically couples each adjacent pair of solar cells and the plurality of conductive interconnects that electrically couples each set of four adjacent solar cells.

17. The conductive interconnect of claim 1, wherein the first concave surface is configured to directly and physically contact the first edge of the first solar cell while the center portion conducts electricity between the first end and the second end.

18. The system of claim 4, wherein the first concave surface is configured to directly and physically contact the first edge of the first solar cell while the center portion conducts electricity between the first end and the second end.

19. A method comprising:
connecting a first solar cell to a second solar cell with a conductive interconnect that comprises:
a first end configured to conduct electricity at a first terminal of the first solar cell;
a second end configured to conduct electricity at a second terminal of the second solar cell, wherein the first end and the second end are aligned on a first axis;
a center portion connecting the first end to the second end and configured to conduct electricity between the first end and the second end;
a first concave opening formed by a first concave surface of the first end and the center portion, wherein the first concave opening is oriented in a first direction substantially perpendicular to the first axis, and wherein the first concave surface directly and physically contacts a first edge of the first solar cell; and
a second concave opening formed by a second concave surface of the second end and the center portion, wherein the second concave opening is oriented in a second direction substantially perpendicular to the first axis opposite the first direction, and wherein the second concave surface directly and physically contacts a second edge of the second solar cell.

20. The conductive interconnect of claim 1, wherein the first concave surface is configured to mechanically contact the first edge of the first solar cell and the second concave surface is configured to mechanically contact the second edge of the second solar cell.

* * * * *